(12) United States Patent
Powell

(10) Patent No.: US 11,363,226 B2
(45) Date of Patent: Jun. 14, 2022

(54) PING PONG READOUT STRUCTURE IN IMAGE SENSOR WITH DUAL PIXEL SUPPLY

(71) Applicant: SHENZHEN GOODIX TECHNOLOGY CO., LTD., Shenzhen (CN)

(72) Inventor: Matthew Powell, Austin, TX (US)

(73) Assignee: Shenzhen Goodix Technology Co., Ltd., Shenzhen (CN)

(*) Notice: Subject to any disclaimer, the term of this patent is extended or adjusted under 35 U.S.C. 154(b) by 233 days.

(21) Appl. No.: 16/859,990

(22) Filed: Apr. 27, 2020

(65) Prior Publication Data

US 2021/0337148 A1    Oct. 28, 2021

(51) Int. Cl.
*H04N 5/3745* (2011.01)
*H04N 5/357* (2011.01)
*H04N 5/369* (2011.01)
*H03M 1/12* (2006.01)
*H04N 5/378* (2011.01)

(52) U.S. Cl.
CPC ............ *H04N 5/378* (2013.01); *H03M 1/121* (2013.01); *H04N 5/37455* (2013.01)

(58) Field of Classification Search
None
See application file for complete search history.

(56) References Cited

U.S. PATENT DOCUMENTS

| 2004/0159771 | A1 | 8/2004 | Yang et al. |
| 2005/0151571 | A1* | 7/2005 | Brown ............... H02M 3/157 327/172 |
| 2014/0267858 | A1* | 9/2014 | Ohtsuki ............. H04N 5/378 348/302 |
| 2017/0214869 | A1* | 7/2017 | Ladd ................. H04N 5/357 |
| 2018/0124332 | A1 | 5/2018 | Evans |
| 2018/0278876 | A1* | 9/2018 | Matsumoto ......... H04N 5/3575 |

FOREIGN PATENT DOCUMENTS

CN    102202187 A    9/2011

* cited by examiner

*Primary Examiner* — Mark T Monk
(74) *Attorney, Agent, or Firm* — Kilpatrick Townsend & Stockton LLP

(57) ABSTRACT

An image sensor includes a pixel array having a plurality pixels arranged in a plurality of pixel clusters coupled to a plurality of column busses, a plurality of voltage supplies coupled to the plurality of pixel clusters, and ping-pong readout circuitry. Pixel clusters in adjacent column busses are supplied with different voltage supplies. The ping-pong readout circuitry includes multiplexing circuitry coupled to the plurality of column busses, and a plurality of analog-to-digital converters coupled to the multiplexing circuitry. The image sensor also includes a controller configured to selectively couple a pixel signal of a pixel cluster to a column bus to an ADC for signal conversion.

19 Claims, 12 Drawing Sheets

PING PONG READOUT STRUCTURE IN IMAGE SENSOR WITH DUAL PIXEL SUPPLY

TECHNICAL FILED

The present invention relates to image sensors and analog-to-digital converters (ADCs) and voltage supplies for the pixels of image sensors, and more particularly to ping-pong readout architectures that reduce cross-talk between pixels and readout power consumption.

BACKGROUND OF THE INVENTION

Modern image sensors with high pixel count attempt to achieve high frame rate, low read noise and high dynamic range with minimal power consumption. The basic function of a modern CMOS image sensor (CIS) is to capture photons that are converted into electrons in a photodiode. These captured electrons of the CIS photodiodes are read out by a series of ADCs included as part of the sensor. In the read out chain, the ADC which converts the signal charges (electrons) from the pixel into a digital code tends to dominate the power consumption. Higher power in the ADC can provide lower read noise or higher dynamic range, which results in improved image quality. But higher power consumption also results in shorter battery lifetimes and thermal heating, which has intrinsic limits in consumer products and can lead to worse sensor performance in the context of CIS.

Additionally, in order to read out a large CIS array in a small amount of time, it may require a large number of ADCs. For example, a 48-megapixel array may require 4000 independent ADCs. The total die area occupied by the ADCs is quite substantial and may drive product cost.

BRIEF SUMMARY OF THE INVENTION

The present invention discloses an integrated-circuit image sensor including a plurality of pixel clusters coupled to different voltage supplies and ping-pong readout architectures that reduce cross-talk between pixels and readout power consumption. A system, method, and device implementing such ping-pong readout architectures are disclosed. In one embodiment, an image sensor includes a pixel array having a plurality pixels arranged in a plurality of pixel clusters, which are coupled to a plurality of column busses, a plurality of voltage supplies coupled to the plurality of pixel clusters, wherein pixel clusters in adjacent column busses are supplied with different voltage supplies, ping-pong readout circuitry, and a controller. The ping-pong readout circuitry includes multiplexing (MUX) circuitry coupled to the plurality of column busses, and a plurality of analog-to-digital converters (ADCs) coupled to the MUX circuitry. The controller is configured to selectively couple a pixel signal of a pixel cluster to a column bus to an ADC through the MUX circuitry for signal conversion.

In one embodiment, the MUX circuitry comprises a plurality of multiplexers, each multiplexer having M inputs coupled to M different column busses and an output coupled to one of the ADCs, where M is a positive integer greater than unity.

In one embodiment, each pixel cluster includes a matrix of at least two columns of pixels and at least one row of pixels, each pixel of two adjacent pixel clusters is alternatively read out through two different column buses to an ADC by the MUX circuitry under control of the controller.

In one embodiment, the plurality of voltage supplies include two low-dropout voltage regulators (LDOs) having a same nominal voltage and electrically separated from each other.

In one embodiment, each of the ADCs includes a comparator and a counter. In one embodiment, each of the ADCs comprises a comparator, a counter, and an amplifier disposed between the MUX circuitry and the comparator.

In one embodiment, the image sensor may further include a data storage coupled to the plurality of ADCs and configured to store converted data of the pixels.

Embodiments of the present invention also provide an image sensor, which includes a pixel array having a plurality pixels arranged in a plurality of pixel clusters coupled to a plurality of column busses, and a plurality of voltage supplies coupled to the plurality of pixel clusters, the voltage supplies having a same nominal voltage and physically separated from each other, wherein pixel clusters in adjacent column busses are supplied with different voltage supplies. The image sensor also includes a plurality of analog-to-digital converters (ADCs) coupled to the plurality of column busses. Each ADC includes an input stage containing a first operational amplifier and a second operational amplifier connected in parallel, and each of the first and second operational amplifiers includes a variable bias current and configured to receive a pixel signal of a pixel cluster coupled to a column bus.

In one embodiment, each of the first operational amplifier and the second operational amplifier includes a first input coupled to an pixel of a pixel cluster through a column bus, a second input coupled to a reference voltage, a first capacitor coupled between the first input and ground, and a switch disposed between the first input and a multiplexer.

In one embodiment, the image sensor further includes a second capacitor disposed between a column bus and the first capacitor and configured to charge the first capacitor with a signal voltage. In one embodiment, the signal voltage is a reset voltage when an ADC is in a reset conversion phase, and the signal voltage is a pixel signal voltage when the ADC is in a signal conversion phase.

In one embodiment, the variable bias current of the first operational amplifier is greater than the variable bias current of the second operational amplifier small when the ADC performs a conversion of pixel signal passing through the first operational amplifier, and vice versa.

Embodiments of the present invention also provide a method for reading out pixel signals from an image sensor. The image sensor includes a pixel array having a plurality pixels arranged in a plurality of pixel clusters coupled to a plurality of column busses, a plurality of voltage supplies coupled to the plurality of column busses, wherein adjacent column busses are supplied by different voltage supplies, a plurality of multiplexers having a set of inputs coupled to a set of column busses, a plurality of analog-to-digital converters (ADCs) coupled to the multiplexers, and a controller configured to selectively coupled a pixel signal of a column bus to an ADC through one of the multiplexers. The method includes providing a plurality of multiplexers, each of the multiplexers having a set of inputs, coupling each input of the set of inputs of a multiplexer to a column bus of the column busses, and time sequentially reading out pixel signals in pixel clusters associated with a set of column busses. The method also includes alternatively selecting a column bus from the set of column busses to an output of the multiplexer by the controller, and converting a pixel signal disposed on the selected column by an ADC coupled to the multiplexer.

Numerous benefits are achieved by way of the present invention over conventional devices and methods. Reading out pixel signals using a ping-ponging readout scheme, signal interference is reduced. Embodiments of the present invention, along with many of its advantages and features, are described in more detail in conjunction with the text below and attached figures.

BRIEF DESCRIPTION OF THE DRAWINGS

Embodiments of the present disclosure are illustrated and described by way of example and not by way of limitation in the figures of the accompanying drawings in which like references indicate similar elements. The drawings are not necessarily to scale, emphasis is placed on illustrating the principles of the inventive concepts. For example, the dimensions of some of the elements are exaggerated relative to each other for clarity.

DETAILED DESCRIPTION OF THE INVENTION

Figure 1:
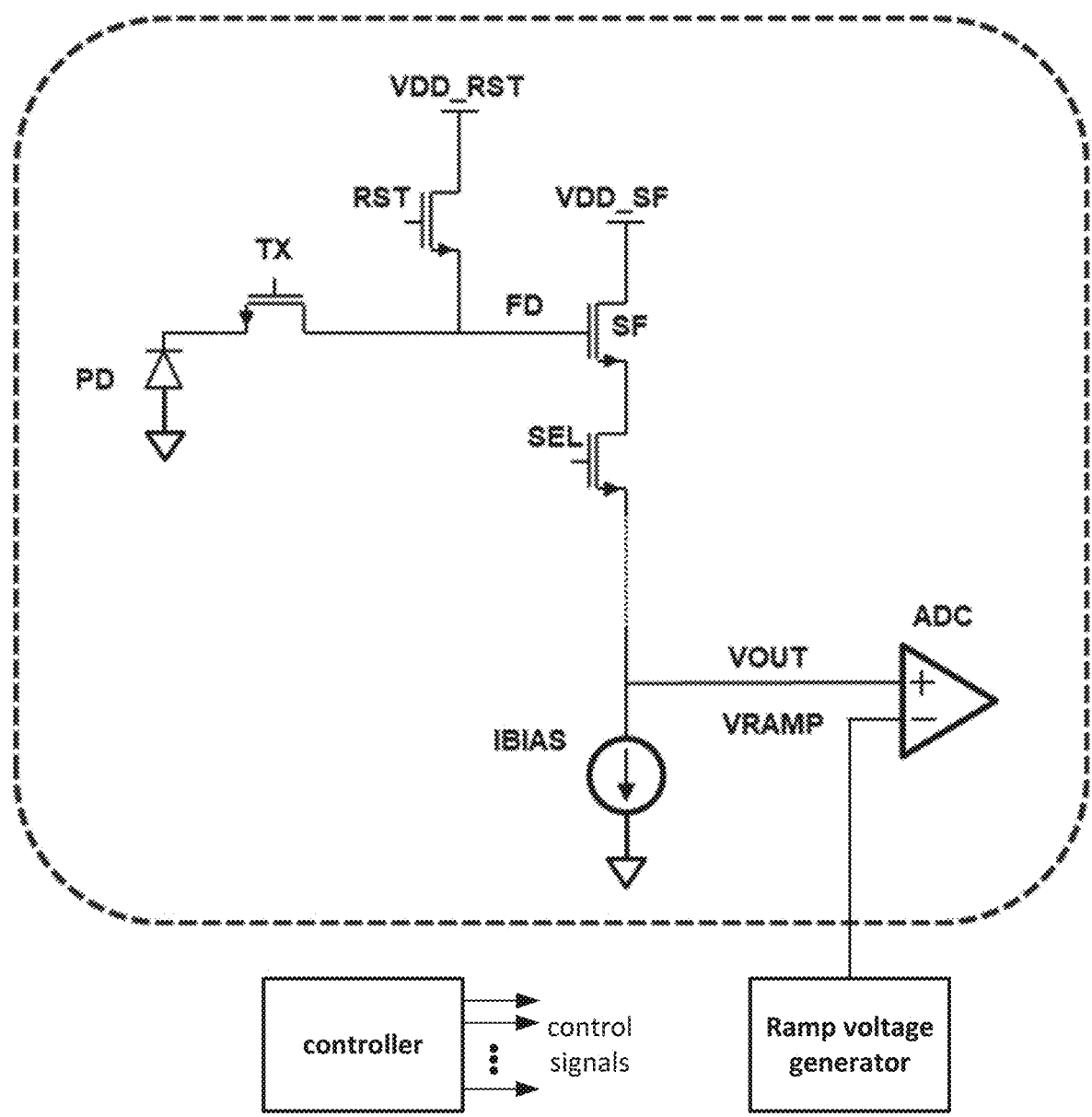
FIG. 1 is a block diagram of a pixel coupled to an example readout circuit according to an embodiment of the present disclosure.

FIG. 1 is a block diagram of a pixel coupled to an example readout circuit according to an embodiment of the present disclosure. Referring to FIG. 1, the pixel includes a photodiode (or a photosensitive element) PD, a transfer transistor TX coupled to the photodiode PD, a source follower SF having a gate coupled to the transfer transistor TX, a reset transistor RST coupled to a floating diffusion node FD disposed between the transfer transistor TX and the gate of the source follower SF. The reset transistor RST is configured to charge the floating diffusion node FD to the reset voltage VDD_RST when the reset transistor RST is turned on, thereby resetting the floating diffusion node FD. The photodiode PD may be reset along with the floating diffusion node FD by turning on the transfer transistor TX. The source follower SF has a terminal coupled to the source follower voltage VDD_SF and another terminal coupled to a select transistor SEL. The select transistor SEL has a gate coupled to a row select line (not shown) and is disposed between the source follower SF and a voltage readout line that provides an analog output pixel signal VOUT to an analog-to-digital converter ADC. The select transistor SEL is coupled to a current source IBIAS. In one embodiment, the transfer transistor TX, the reset transistor RST, the source follower SF, and the select transistor SEL are NMOS transistors.

In one embodiment, the analog-to-digital converter ADC includes a comparator and a counter and receives a ramp voltage VRAMP from a ramp voltage generator. As used herein, the ramp voltage generator may be referred to as ramp generator. The ramp voltage VRAMP may also be referred to as ramp, ramp signal, or ramp voltage signal. The ramp voltage VRAMP increases with time at a constant rate. Referring to FIG. 1, the readout circuit may also include a controller configured to generate control signals to turn on and off the transfer transistor TX, the reset transistor RST, the source follower SF, and the select transistor SEL. The controller also provides control signals to the ramp voltage generator for controlling the ramp voltage VRAMP during different time intervals in the reset conversion phase and in the signal conversion phase (alternatively referred to as signal measurement phase). In one embodiment, the controller can be implemented as a separated device disposed outside the readout circuit. In another embodiment, the controller can be integrated in the image sensor including an array of pixels and a plurality of readout circuits. The ramp voltage generator provides a ramp voltage to the readout circuits. The ADC, the controller, and the ramp voltage generator will be described in more detail below. It is noted that references to "an embodiment" or "one embodiment" in the present disclosure are not necessarily the same embodiment.

Figure 2:
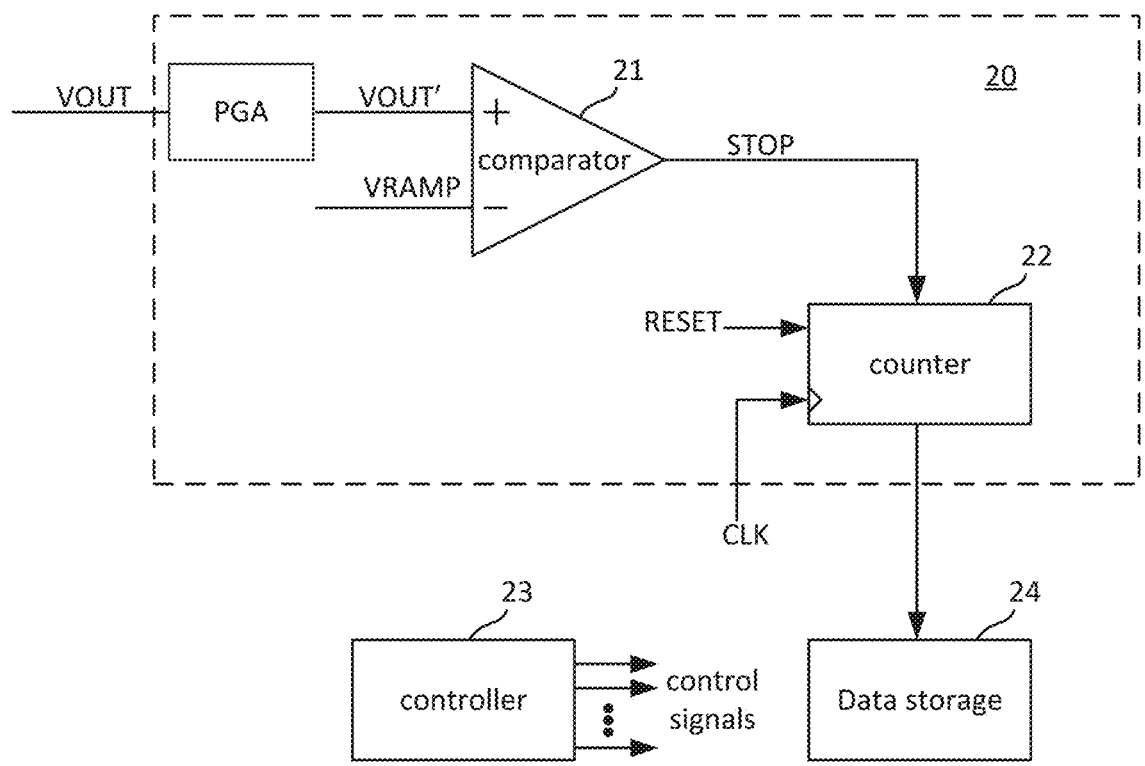
FIG. 2 is a simplified block diagram of an analog-to-digital converter according to an embodiment of the present disclosure.

FIG. 2 is a simplified block diagram of an analog-to-digital converter (ADC) 20 according to an embodiment of the present disclosure. The analog-to-digital convert 20 includes a voltage comparator 21 and a counter 22 coupled to the comparator 21. The counter 22 receives a reference clock signal CLK and a reset signal RESET. The counter 22 counts in response to the reference clock signal CLK while the comparator 21 compares the pixel output signal VOUT with the ramp voltage VRAMP. When the ramp voltage VRAMP reaches or exceeds the level of VOUT, the comparator 21 outputs a comparison signal STOP to the counter 22. In response, the counter 22 stops counting and the count value stored in the counter is a digital word that represents the pixel output signal VOUT. Referring to FIG. 2, a controller 23, in additional to provide control signals to turn on and off the transistors to readout analog signals of pixels of an image sensor, also outputs control signals to latch the count value stored in the counter 22 to a data storage 24, transfer the count value to a processor (not shown) for further processing, and reset the counter 22. The controller 23 may reset the counter 22 after latching the count value.

In one embodiment, the counter 22 may be a synchronous counter. In another embodiment, the counter 22 may be a binary ripple counter.

In one embodiment, the ADC 20 may further include a programmable gain amplifier (PGA) disposed before the comparator 21, i.e., the PGA is disposed between the pixel output signal VOUT and the comparator and scales the pixel output signal VOUT with a programmable gain prior to providing the amplified (scaled) pixel output signal VOUT' to the comparator 21. The PGA provides the flexibility to increase the ramp rate of the ramp signal VRAMP. The increase in the ramp rate allows additional analog-to-digital conversions that provide the benefit of a reduction in thermal noise from both the ADC and the PGA. It is noted that, while increasing the ramp rate will only effect the noise contribution per conversion from the ADC, that contribution is reduced by the gain from the PGA.

In one embodiment, an ADC architecture in high pixel count image sensors is a ramp ADC. In a ramp ADC a single linear slope voltage ramp is provided to many ADCs (usually thousands) along with a reference clock (e.g., clock signal CLK). Each ADC contains a comparator to compare the voltage output from the pixel to the ramp voltage. Each ADC also contains a digital circuit (e.g., counter 22) to count clock cycles. Each ADC captures the number of clock cycles from the start of the ramp to the moment that the ramp voltage exceeds the pixel output voltage. The benefit of this architecture is that each of many instances of the ADC only needs to include a simple comparator and a digital counter. The ramp generator circuit has many more components and considerable power consumption compared to the comparator in each ADC, but only one of them is needed for the entire image sensor so the overall area and power requirement for the ramp generator is a small fraction of the total ADC area and power.

Figure 3:
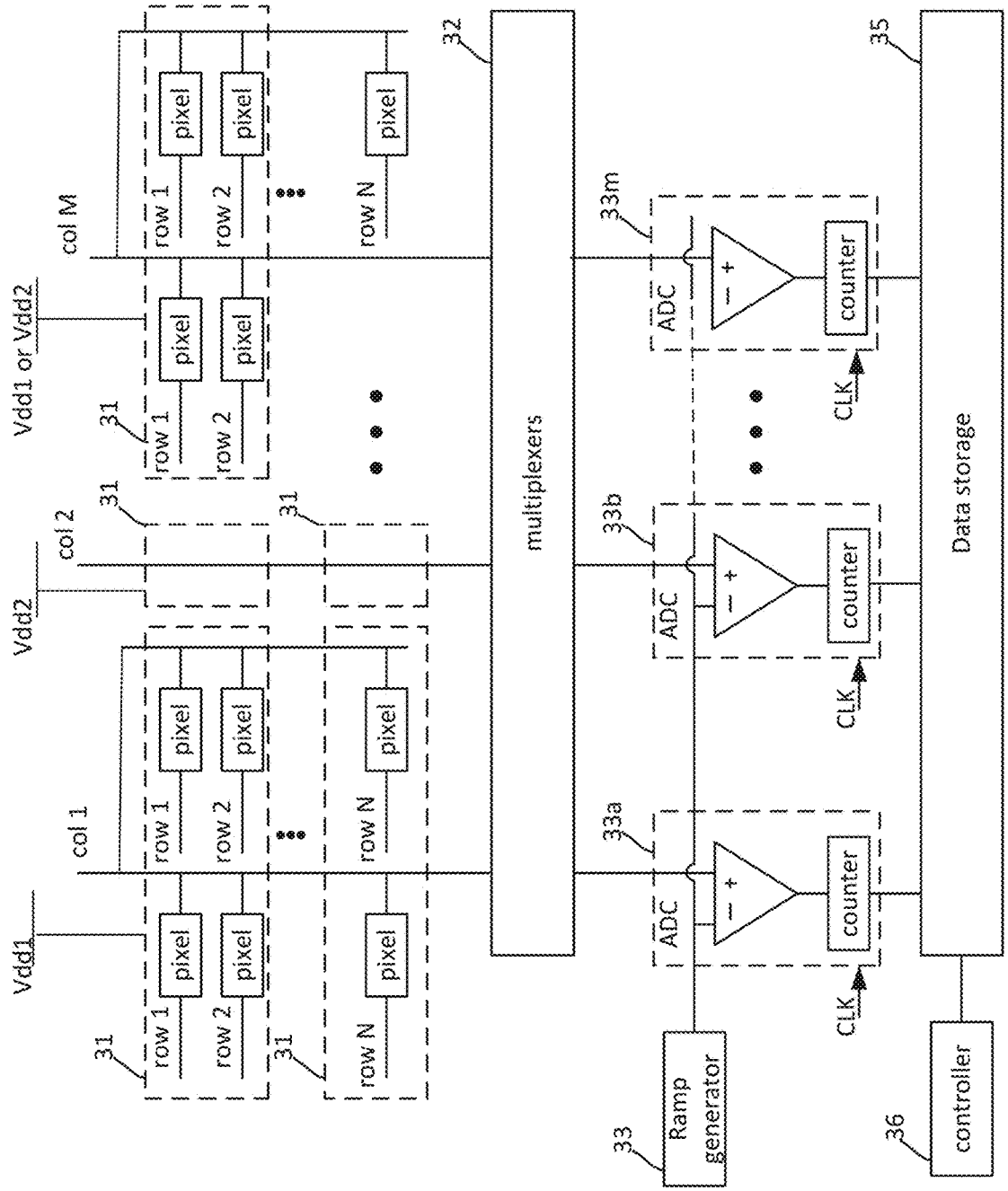
FIG. 3 is a simplified schematic block diagram illustrating a ping-pong readout architecture according to an embodiment of the present disclosure.

FIG. 3 is a simplified schematic block diagram illustrating an image sensor 30 including a pixel array coupled to a ping-pong readout architecture according to an embodiment of the present disclosure. Referring to FIG. 3, the image sensor 30 includes a pixel array having N rows of pixels and M column busses of pixels, the pixels are grouped into a plurality of pixel clusters 31 and provided to a plurality of multiplexers 32 via a plurality of column busses. The term "pixel cluster" refers to a group of pixels sharing a common column bus and supplied with a same voltage supply. In accordance with the present invention, the adjacent pixels are grouped into a pixel cluster, which shared a column bus, i.e., adjacent pixels on the same row may be coupled to the same column bus and provided by a same voltage supply. That is, the number of column busses is less than the number of pixel columns in the image sensor according to embodiments of the present disclosure.

In one embodiment, the pixel clusters grouped in a number X of column busses are coupled to X inputs of a multiplexer having an output coupled to one of the analog-to-digital converters (ADCs) 33a, 33b, . . . , 33m. Each of the ADCs may include a comparator and a counter as shown in FIG. 2. The counters each receive a common clock signal CLK and includes a count value corresponding to an analog pixel signal received from a pixel cluster of an associated column. The count value of each counter is latched into a data storage 35 in response to control signals provided by a controller 36. In accordance with the present invention, pixel signals on a certain number of columns are applied to a common analog-to-digital converter (ADC) on a time interleaved basis, i.e., the conversion of the pixel signals on the certain number of columns is performed by time-sharing or "ping-ponging" an ADC between the certain number of columns. The ping-ponging of the common ADC between the certain number of columns is implemented by the operation of a multiplexer. In the embodiment, the common ADC may operate at the same speed as an ADC coupled to one column (i.e., no multiplexer).

In a typical CIS example system, a 48 mega-pixel array may have 8000 pixel columns and 6000 pixel rows. The pixels may be organized in 2×2 clusters with one output per cluster and a column of clusters connecting to a single output line. In this example, there would be 4000 such column outputs. A traditional configuration might have 4000 ADCs which operate simultaneously on these 4000 outputs. To process the entire array, each ADC must perform a total of 12000 conversions. In a typical scenario the pixel cluster will drive its output with a source follower transistor configuration. A typical source follower bias current in this scenario is 5 μA, or 20 mA for the entire array. A typical power consumption for each ADC in this scenario could be 20 μA or 80 mA for the entire array. The total analog power consumption in this example would then be 100 mA.

Assuming some overhead to implement the ping pong architecture, the ADC may be required to consume 25 μA each to have the same performance. With 2000 ADC the total ADC current would then be 50 mA and the total analog power consumption would be 70 mA. Thus, a power consumption reduction of 30% can be achieved.

An additional benefit of this scheme is that by reducing the number of ADCs by a factor of 2, the total ADC area can be reduce by almost 50%, taking into account some overhead required to implement the ping-pong architecture.

Additionally, instead of just lowering power consumption some embodiments could alternatively spend more power per ADC, either increasing the dynamic range or lowering the read noise. Alternatively, in another embodiment, instead of reducing the number of ADCs, the number of pixel outputs could be increased and the number of sequential conversions to read out the entire array could be reduced. In some embodiments, if the number of outputs were increased 2×, the total array read out time could be reduced by 2×, which is equivalent to increasing the frame rate by a factor of 2×.

In accordance with some embodiments of the present invention, in order to improve the power consumption/noise tradeoff in the CIS read out chain, a novel approach is for each ADC to ping-pong between two pixel output columns. In a large pixel count image sensor, for example 12-mega-pixel or more, it is normal for a significant amount of the time during pixel readout to be taken by the pixel output settling. During this time, the ADC is not performing much useful function, but it is difficult to shut down the ADC to save power since it would result in large transients on the power supply that would disrupt the pixel settling and read out operations and result in added pixel read noise. Instead, the novel implementation proposes each ADC to process the output from two pixel columns. While one pixel output is settling, the ADC is performing a conversion on the other output. Then the ADC switches to the now settled output to perform a conversion while the other pixel column switches to the next pixel row and begins settling.

In some embodiments, the novel implementation also includes providing a different voltage supply for two alternate pixel column busses. The pixel settling process is hugely disruptive to the pixel supply voltage. Pixel output powered by a noisy supply will have noisy read outs. In order to avoid pixel outputs which are still settling from impacting pixel outputs which are already settled and in the process of being converted into a digital code by the ADC, some embodiments provide two pixel supplies from two different low-dropout voltage regulators (LDOs) with the same nominal voltage but are not electrically connected to adjacent columns, i.e., the LDOs (e.g., Vdd1, Vdd2) may have the same nominal voltage but are electrically and physically separated from each other, e.g., by an interlayer dielectric layer.

Figure 4:
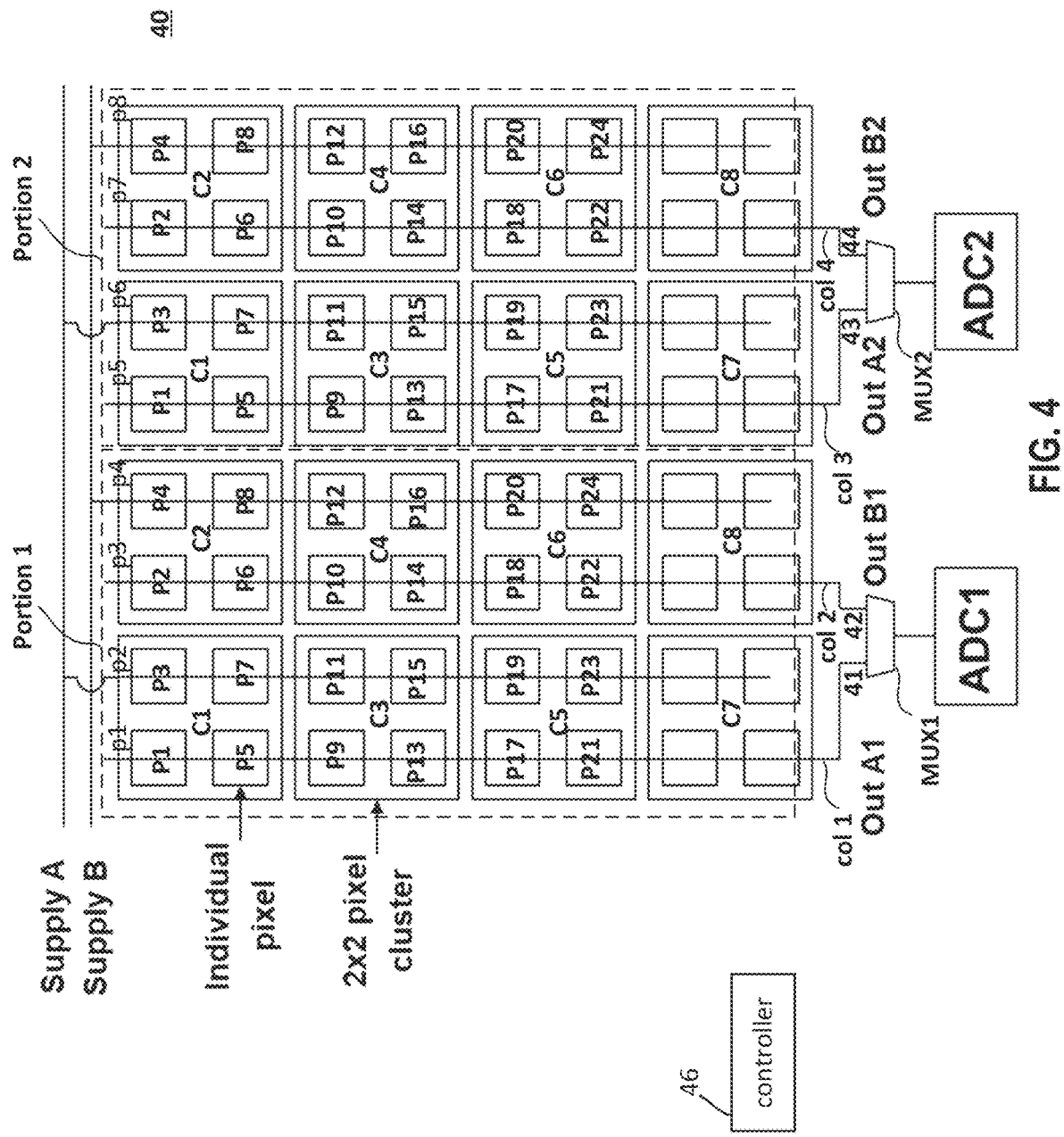
FIG. 4 is a simplified schematic block diagram illustrating an example ping-pong readout architecture according to an embodiment of the present disclosure.

FIG. 4 is a simplified schematic block diagram illustrating an example ping-pong readout architecture 40 according to an embodiment of the present disclosure. Referring to FIG. 4, the 8×8 pixel array is split into two identical portions: portion 1 and portion 2, each portion has the same layout structure and is controlled by the same control signals provided by the controller 46. As used herein, the upper case "P" denotes the reading order of the pixels in the image sensor according to an embodiment of the present disclosure, whereas the lower case "p" denoted the physical layout of the image sensor. That is, the physical pixel layout is arranged from p1, p2, p3, p4, p5, p6, p7, and p8 in the first row in that order. In the example embodiment shown, each of the portion 1 and portion 2 includes 32 pixels having the readout order of P1, P3, P2, and P4 in the first row, P5, P7, P6, and P8 in the second row, P9, P11, P10, and P12 in the third row, P13, P15, P14, and P16 in the fourth row, P17, P19, P18, and P20 in the fifth row, P21, P23, P22, and P24 in the sixth row, and so forth. Signals of the pixels in the portion 1 are provided to a first analog-to-digital converter ADC1 through the column busses col 1 and col 2 and a first 2:1 multiplexer MUX1 through inputs 41 and 42 for signal conversion, and signals of the pixels in the portion 2 are provided to the a second analog-to-digital converter ADC2 through the column busses col 3 and col 4 and a second 2:1 multiplexer MUX2 through inputs 43 and 44 for signal conversion. The ADC1 and ADC2 operate independent from each other, the operations of the ADC1 and ADC2 can thus be concurrently performed according to an embodiment of the present disclosure.

It is noted that embodiments of the present disclosure are not limited to a ping-pong architecture with a 2-to-1 multiplexer (2:1 MUX), 4-to-1 multiplexer (4:1 MUX), or two separate voltage supplies. One skilled in the art will appreciate that other ping-pong architectures can also be used according to other embodiments of the present invention.

Figure 5:
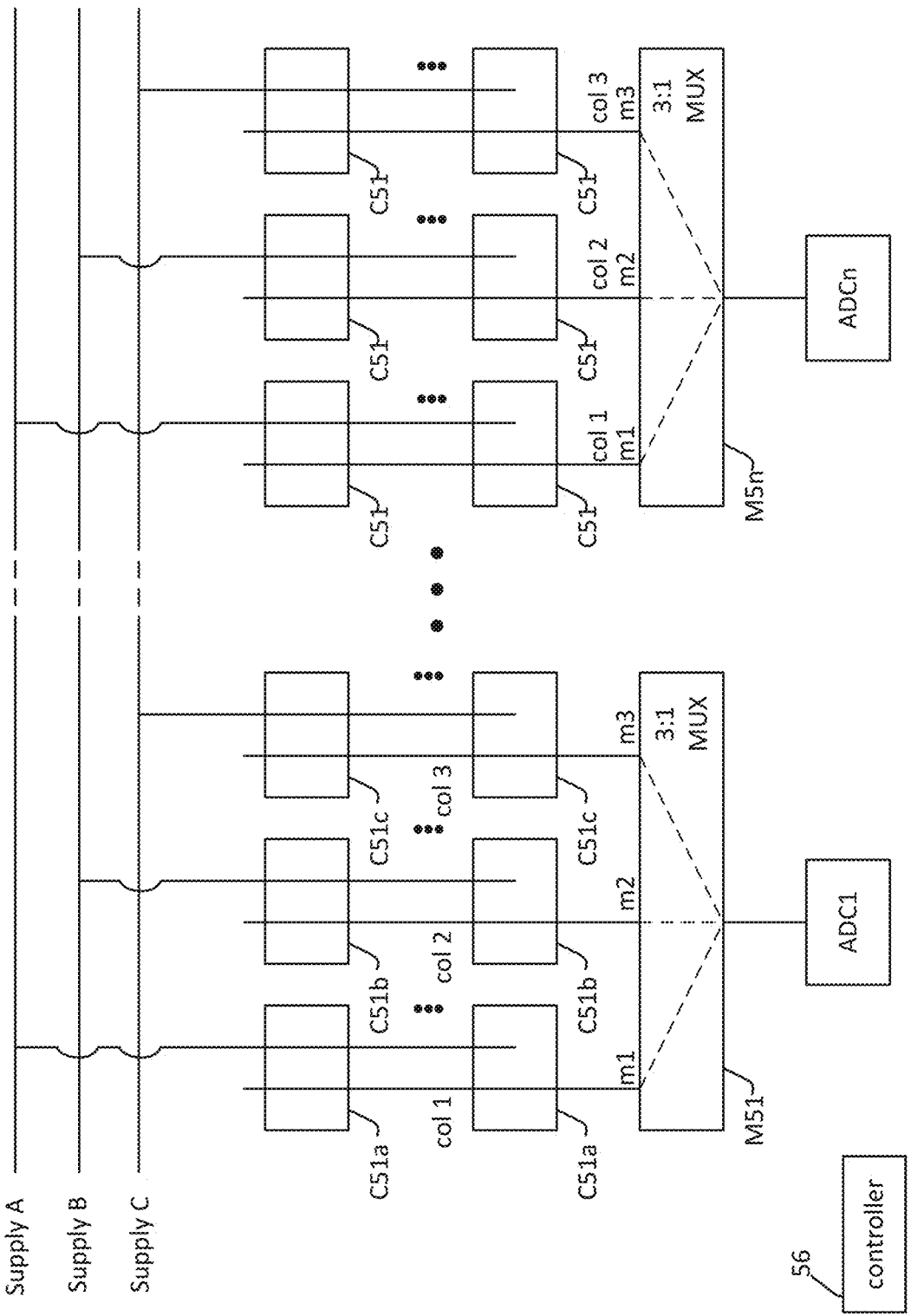
FIG. 5 is a simplified schematic block diagram of an example image sensor having a 3:1 multiplexer according to an embodiment of the present disclosure.

FIG. 5 is a simplified schematic block diagram of an example image sensor 50 having a 3:1 multiplexer according to an embodiment of the present disclosure. Referring to FIG. 5, the image sensor 50 may include a plurality of pixel clusters C51 (C51a, C51b, C51c) arranged in a number of column busses (col 1, col 2, col 3) and in a number of rows. Each pixel cluster C51 includes x by y pixels, where x and y are positive integers. Two adjacent columns of pixel clusters are supplied by a different nominal voltage. In the example shown, pixel clusters C51a coupled to a column bus col 1 are supplied by a voltage supply A, pixel clusters C51b coupled to a column bus col 2 are supplied by a voltage supply B, and pixel clusters C51c coupled to a column bus col 3 are supplied by a voltage supply C. The voltage supplies A, B, and C have the same nominal voltage and are physically and electrically separated from each other. Signal charges of the pixels in the pixel clusters are provided to an ADC through an analog 3:1 multiplexer under control of a controller 56. The analog 3:1 multiplexer has three analog inputs m1, m2, and m3 coupled to the column busses col 1, col 2, and col 3, respectively, and an output coupled to the ADC.

Figure 6:
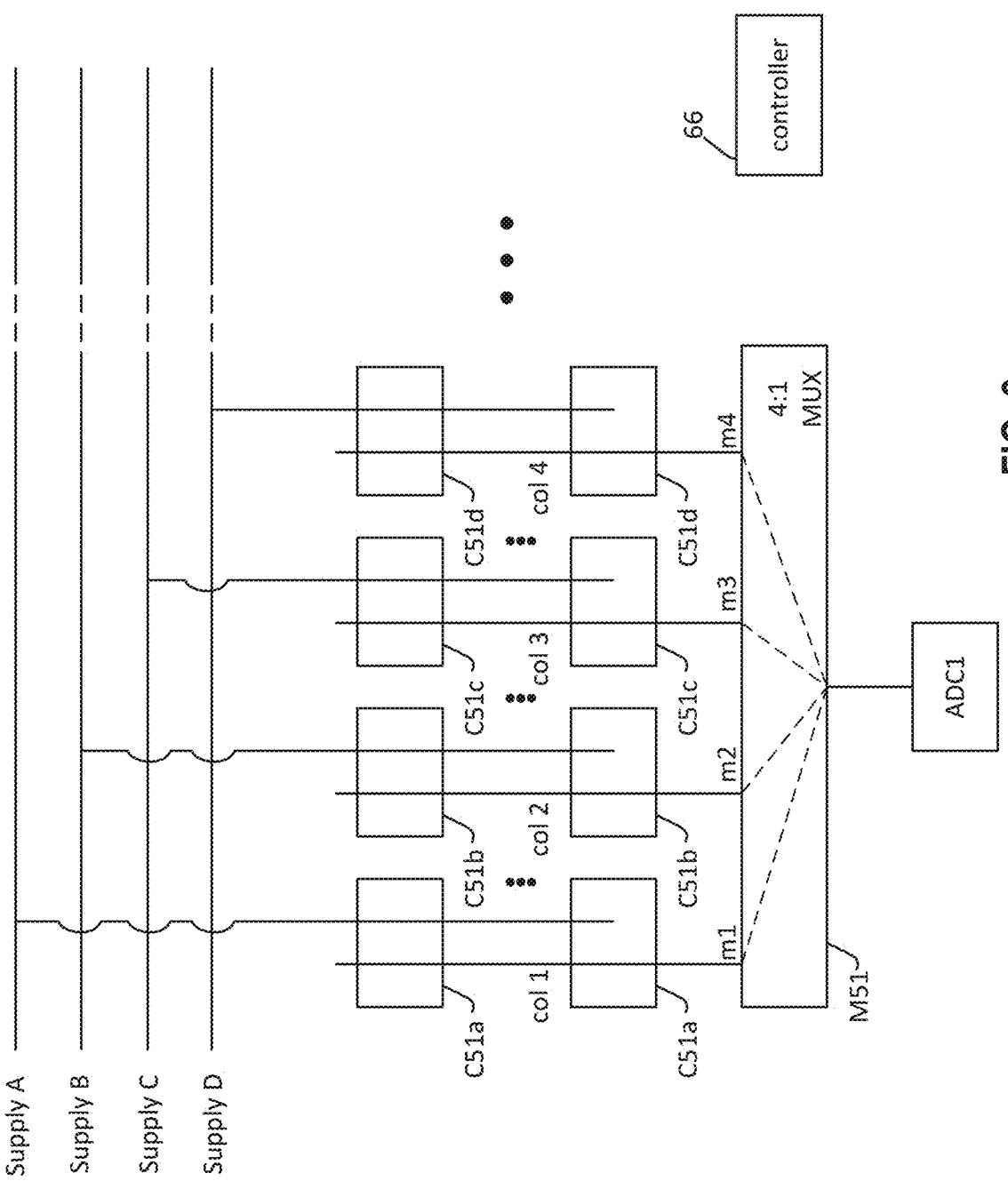
FIG. 6 is a simplified schematic block diagram of an example image sensor having a 4:1 multiplexer according to an embodiment of the present disclosure.

FIG. 6 is a simplified schematic block diagram of an example image sensor 60 having a 4:1 multiplexer according to an embodiment of the present disclosure. Referring to FIG. 6, the image sensor 60 may include a plurality of pixel clusters C51 (C51a, C51b, C51c, C51d) arranged in a number of column busses (col 1, col 2, col 3, col 4) and in a number of rows (row 1, . . . , row N). Each pixel cluster C51 includes x by y pixels, where x and y are positive integers. Two adjacent columns of pixel clusters are supplied by a different nominal voltage. In the example shown, pixel clusters C51a coupled to a column bus col 1 are supplied by a voltage supply A, pixel clusters C51b coupled to a column bus col 2 are supplied by a voltage supply B, pixel clusters C51c coupled to a column bus col 3 are supplied by a voltage supply C, and pixel clusters C51d coupled to a column bus col 4 are supplied by a voltage supply D. The voltage supplies A, B, C, and D have the same nominal voltage and are physically and electrically separated from each other. Signal charges of the pixels in the pixel clusters are provided to an ADC through an analog 4:1 multiplexer under control of a controller 66. The analog 4:1 multiplexer has four analog inputs m1, m2, m3, and m4 coupled to the column busses col 1, col 2, col 3, and col 4, respectively, and an output coupled to the ADC. One of skill in the art will appreciate that other multiplexer configurations can also be used, such as any m-to-1 multiplexer (m:1 MUX) where m is a positive integer (e.g., m=2, 3, 4, 5, 6, 7, 8, etc.). The analog multiplexer may include pass gates or transfer gates. The term pass gate or transfer gate refers to a device that passes a signal when on and blocks the signal when off. For example, a pass gate or transfer gate can be an NMOS transistor that connects between two points and controls the signal passage therebetween.

Figure 7:
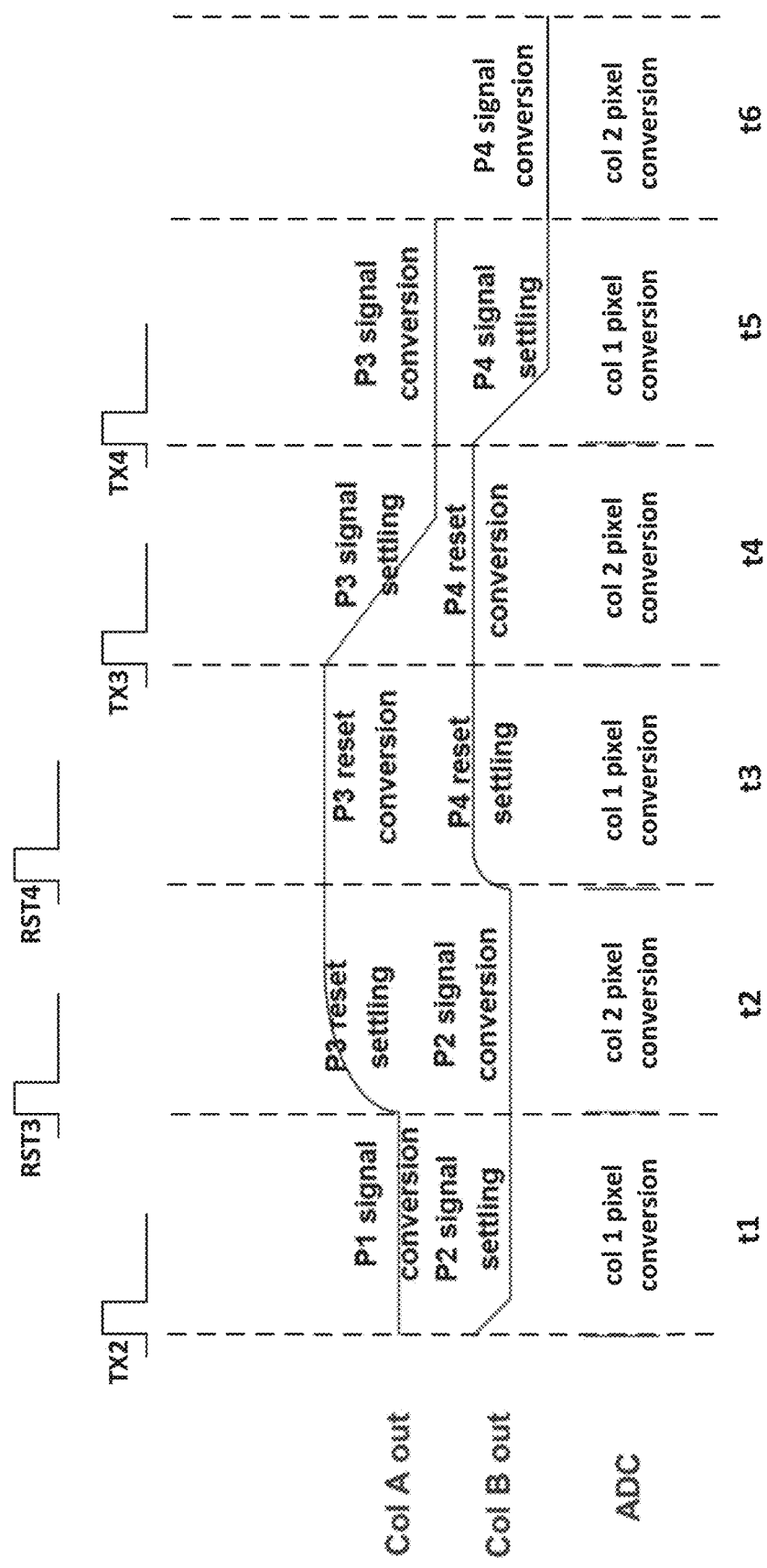
FIG. 7 is a timing diagram illustrating an operation of the example ping-pong readout architecture of FIG. 4 with a 2-to-1 multiplexer according to an embodiment of the present disclosure.

FIG. 7 is a timing diagram illustrating an operation of the example ping-pong readout architecture 40A and 40B of FIGS. 4A and 4B with a 2-to-1 multiplexer according to an embodiment of the present disclosure. To simplify the illustration, only two conversion periods of pixel clusters C1 and C2 with the ADC1 are shown: col 1 pixel P1 signal conversion, col 2 pixel P2 signal conversion, col 1 P3 signal conversion, and col. 2 P4 signal conversion. The signal conversion is performed according to a correlated double sampling operation. The correlated double sampling read out is to cancel the effect of the reset noise by subtracting the sampled signal charges associated with a reset of the floating diffusion node from the sampled signal charges accumulated on the photodiode when the photodiode is exposed to light. Referring to FIG. 7, at t1, the gate of the transfer transistor TX2 is asserted high, turning on the transfer transistor TX2 which passes signal charges of the pixel P2 to the floating diffusion node FD. At that time, the 2:1 MUX 41 passes the signal charges of the pixel P1 to the ADC1 for signal conversion. The conversion result is then saved in the data storage 35 under the control of the controller 36. At t2, the reset transistor RST3 is turned on resetting the floating diffusion node FD of the pixel P3 while the 2:1 MUX 41 passes the signal charges of the pixel P2 on the column bus col 2 to the ADC1 for signal conversion. At t3, the ADC1 performs the reset signal conversion of the pixel P3 while the image sensor resets the pixel P4 by turning on the reset transistor RST4, the reset signal conversion result of the pixel P3 is saved to the data storage 35 under the control of the controller 36. At t4, the signal charges of the pixel P3 is settled on col 1. It is noted that the slew rate of the signal charges of the pixel has a linear characteristic which is dominated by the current source. During t4, the reset signal of the pixel P4 on the col 2 is passed through to the ADC1 for signal conversion and the conversion result is stored in the data storage 35 under the control of the controller 36. At t5, while the signal charges of the pixel P4 settles on the column bus col 2, the signal charges of the pixel P3 on the column bus col 1 is provided to the ADC1 through the multiplexer input 42. The conversion result is then stored in the data storage 35 under the control of the controller 36. At t6, the signal charges of the pixel P4 on the column bus col 2 is provided to the ADC1 through the multiplexer input 43, and the conversion result is then stored in the data storage 35 under the control of the controller 36.

The inventor observed that an additional source of interference in a ping pong readout scheme comes from the control signals on a per row basis. If the TX or RST signal is toggling to initial the RST or electron transfer phase for a photodiode associated with one column output, it may couple to the readout operation in another column, which is intended to be stable while the ADC is measuring the output signal level. Additionally, an initial pixel settling may introduce quite a large kickback to these control signals on a row basis, which is another source of coupling to other pixels in the same row. To improve performance with the ping-pong style readout, it is beneficial to read out from different nearby row on one column vs the other. Embodiments of the present disclosure introduce an additional select control signal on a per row basis which selects either odd or even columns in a 2-1 output mux scenario or any other control scheme which achieves the same effect. In one embodiment, the rows being read out on alternate columns may be adjacent rows. In one embodiment, the rows being read out on alternate columns may be disposed a few rows away. Large row differences require large memory on the image sensor die to store many rows of pixel information before streaming out in the expected row by row order. But small row differences accomplish the desired intent without significantly increasing the on die memory requirement.

Figure 8:
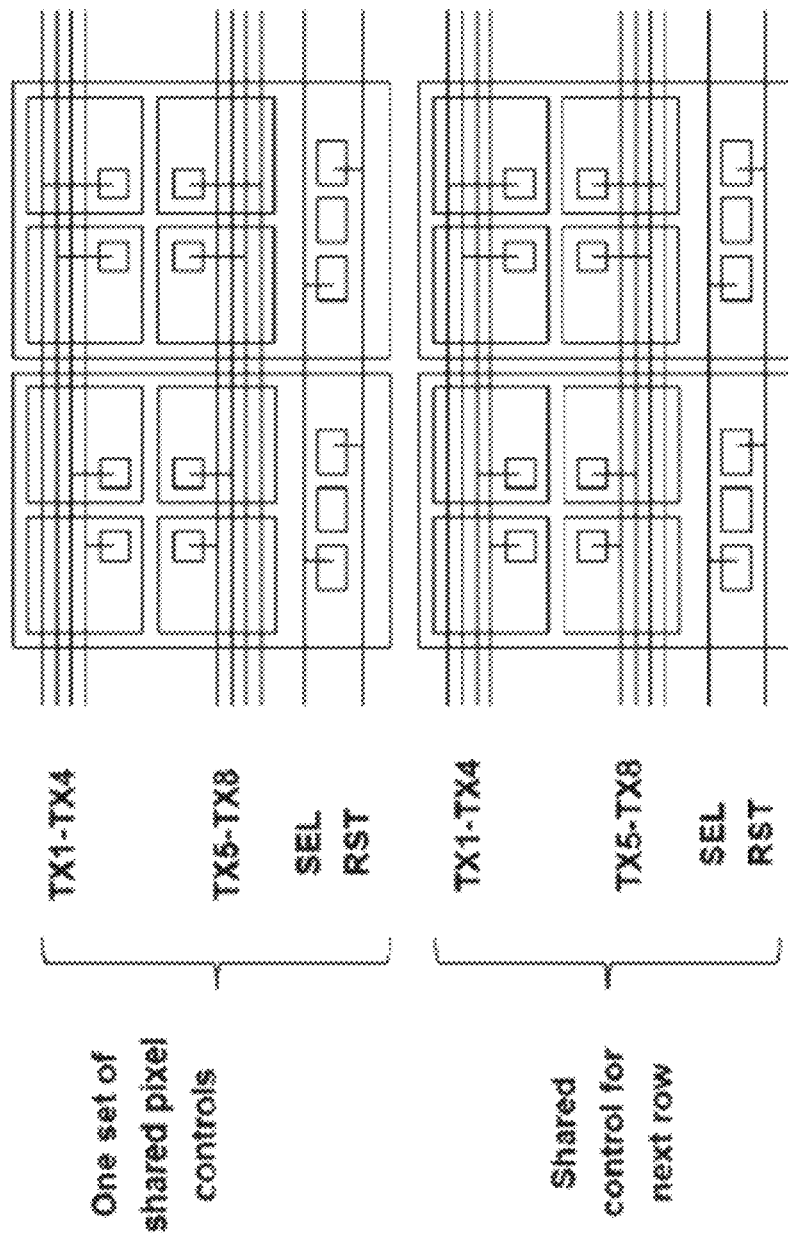
FIG. 8 is a simplified schematic diagram illustrating control signals for an example image sensor having 2×2 pixel clusters according to an embodiment of the present disclosure.

FIG. 8 is a simplified schematic block diagram illustrating control signal connections 80 of a 2×2 shared pixel layout in an image sensor of FIG. 4 according to an embodiment of the present disclosure. Referring to FIG. 8, signals TX1-TX4 and TX5-TX8 denote the control signals to the transfer transistors TX1 to TX4 and TX5 to TX8 of the pixels P1 to P4 and P5 to P8, respectively. The signals SEL and RST refer to the control signals SEL and RST of the pixel as shown in FIG. 1.

Figure 9:
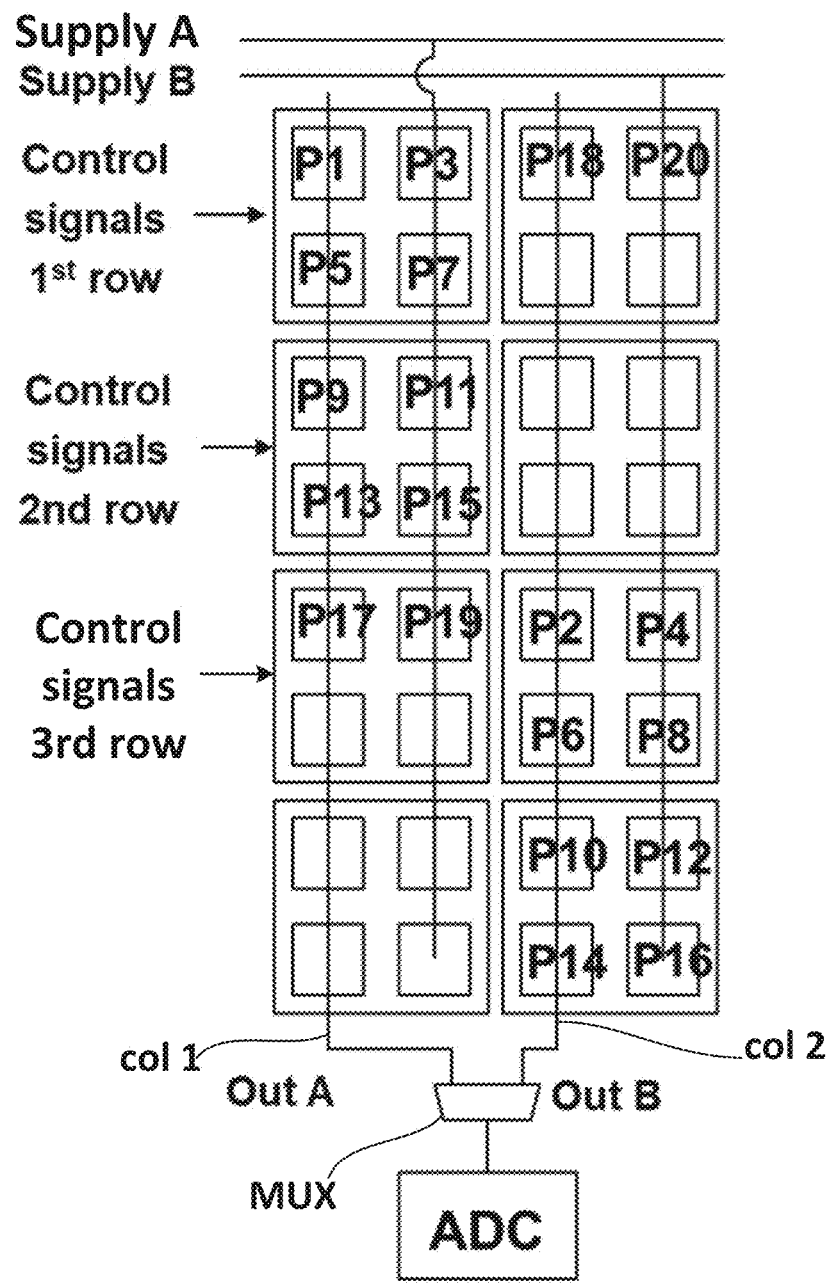
FIG. 9 is a simplified schematic block diagram illustrating an example ping-pong readout architecture of an image sensor with 2×2 pixel clusters according to an embodiment of the present disclosure.

FIG. 9 is a simplified schematic block diagram illustrating an example ping-pong readout architecture of an image sensor with 2×2 pixel clusters according to an embodiment of the present disclosure. It is noted that the pixels are shown in their readout order, and not their physical order in the image sensor. Referring to FIG. 9, the pixel P1 is readout first via a column bus col 1 and an input Out A of an analog 2:1 multiplexer MUX, then the pixel P2 in the third row is readout via a column bus col 2 and an input Out B of the multiplexer MUX. After the signal conversion by the ADC, the data are stored in a data storage (not shown), reordered and provided to a processor for processing.

The inventor further observed that an impairment in the ping pong readout scheme is related to capacitive analog memory at the ADC input stage. When the ADC performs a conversion on one column output, the voltage is stored at the ADC input on a non-zero capacitance which represents the ADC input cap. When the column multiplexer switches to the other column output, the charge stored on this cap is shared with the voltage on the other column output. In general, this will cause a small error in the settled voltage on the column output the ADC is now trying to measure, forcing additional settling time to resolve this small error. In one embodiment, this error can be avoided by duplicating the input stage of the ADC so that the multiplexer instead moves to the output of the first stage of the ADC. To avoid increase in current consumption, a variable bias current for the input stage of the ADC can be used according to an embodiment of the present disclosure. While one ADC front end is helping to perform a conversion, the normal current bias is used. Meanwhile, the other ADC front end has a much smaller bias current applied—just enough so that the column output is not disturbed when this ADC front-end is switched to be part of the active ADC. The bias current can even be shared between front-ends with a portion of the current steered to each ADC on a dynamic basis. In this case, the benefit of having both ADC front-ends with minor impact to current consumption and only modest increase in area can be obtained.

Embodiments of the present disclosure also provide an auto-zero capacitor that is used to remove offset from the ADC and the pixel source follower. This reduces the dynamic range that the ADC is required to cover since there is no need to add the offset level (which can be quite large, i.e., 50 mV or more) to the signal level and removes some other offset dependent code readout effects that might occur. The basic mechanism is to store the offset of the ADC and the source follower output on a cap, either on the column output path to the ADC, or alternatively on the reference path. This normally occurs during the early phase of the reset period when the column output has settled to a relatively small level (1-10 mV), but still not as small as desired for ADC conversion (1-100 μV). In either case, when the ADC front-end for a ping-pong readout is duplicated, this offset storage capacitor can also be duplicated. This allows embodiments of the present disclosure to get the full benefit of auto-zero in the ping-pong scheme as well.

Figure 10:
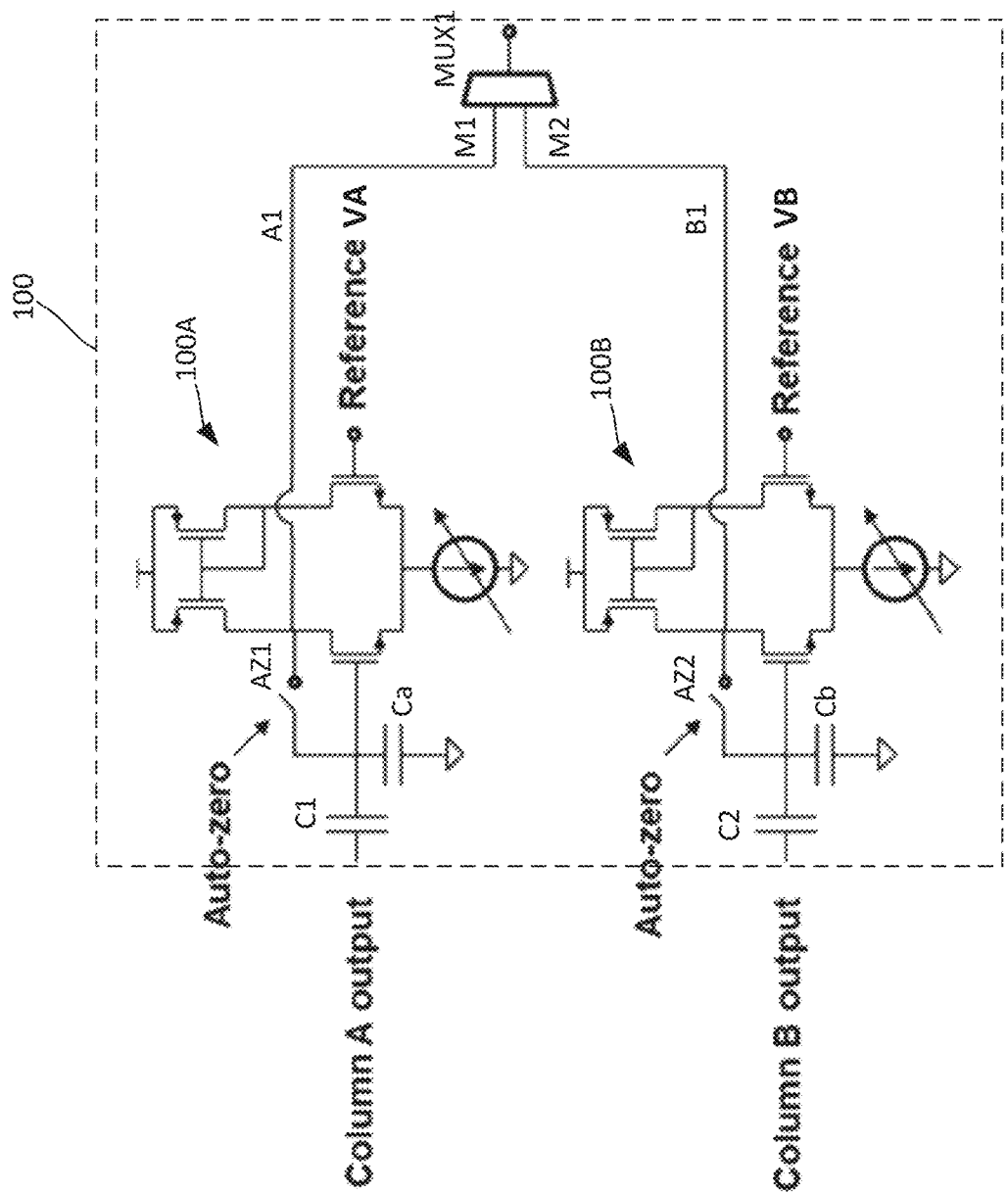
FIG. 10 is a simplified schematic block diagram illustrating a duplicate ADC input stage to avoid offset settling according to an embodiment of the present disclosure.

FIG. 10 is a simplified schematic block diagram illustrating a duplicate ADC input stage 100 to avoid offset settling according to an embodiment of the present disclosure. Referring to FIG. 10, the duplicate ADC input stage 100 includes a first operational amplifier 100A having a first input coupled to a capacitor Ca and a second input coupled to a reference voltage VA. The capacitor Ca is coupled to an input M1 of an analog multiplexer MUX1. A pixel signal on a column bus A is applied to the first input of the first operational amplifier 100A through a capacitor C1. The signal A1 is provided to the capacitor Ca via an auto-zeroing switch AZ1. That is, during the auto-zeroing phase, the signal A1 is stored in Ca. During the signal conversion mode, the switch AZ1 is open, the capacitor Ca is now charged up to the value of the pixel signal, corresponding to the difference between the pixel signal and the offset voltage of the floating diffusion node and the input stage of the ADC.

The duplicate ADC input stage 100 also includes a second operational amplifier 100B having a first input coupled to a capacitor Cb and a second input coupled to a reference voltage VB. The capacitor Cb is coupled to an input M2 of the analog multiplexer MUX1. A pixel signal on a column bus B is applied to the first input of the second operational amplifier 100B through a capacitor C2. The signal B1 is provided to the capacitor Cb via an auto-zeroing switch AZ2. That is, during the auto-zeroing phase, the signal B1 is stored in the capacitor Ca. During the normal signal conversion mode, the switch AZ1 is open, the capacitor Cb is now charged up to the value of the pixel signal, corresponding to the difference between the pixel signal and the offset voltage.

Figure 11:
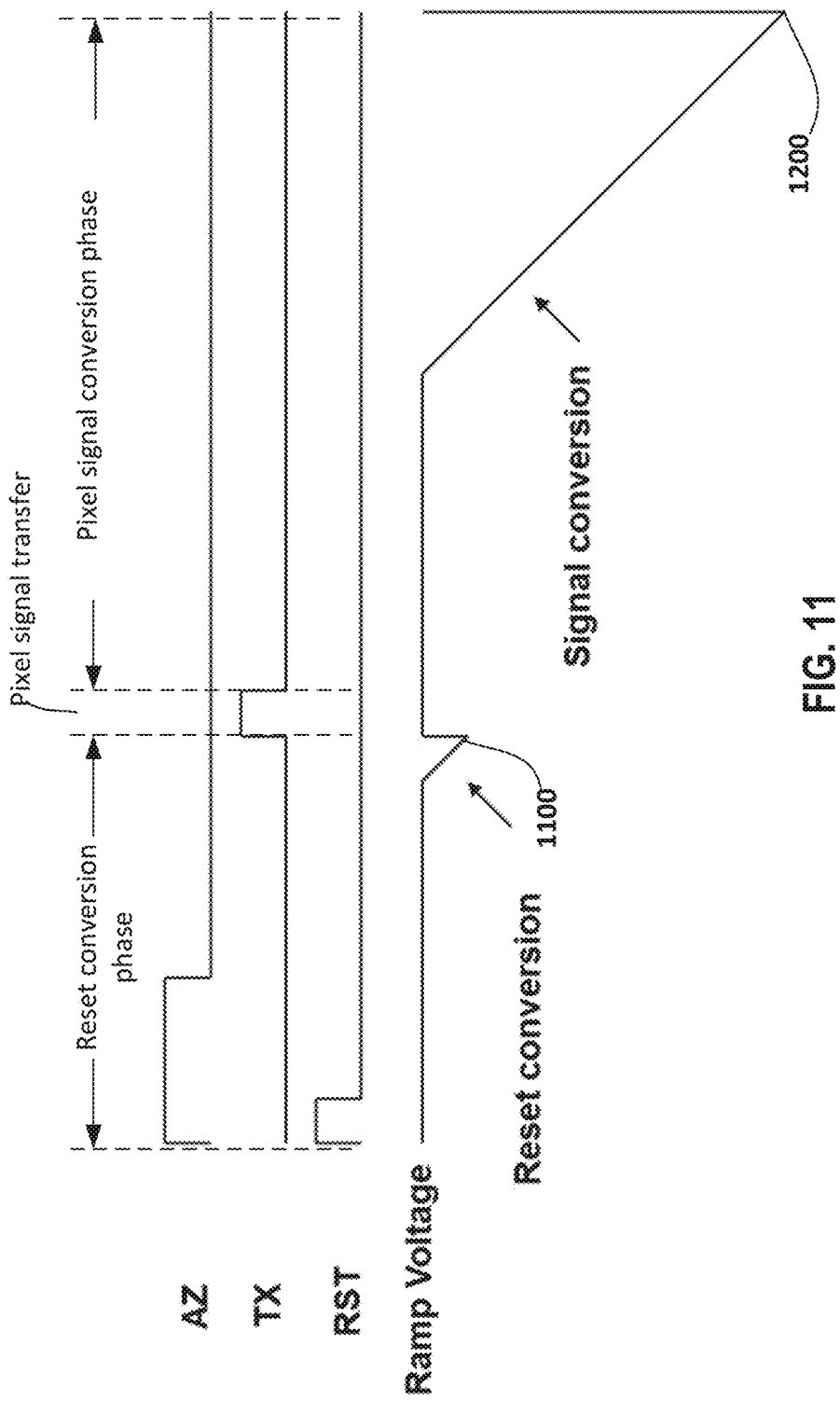
FIG. 11 is a timing diagram illustrating the timing of the auto-zeroing process of a signal path of a column signal in the duplicate ADC input stage of FIG. 10.

FIG. 11 is a timing diagram illustrating the timing of the auto-zeroing process of the signal path of the column A signal output duplicate ADC input stage of FIG. 10. The auto-zeroing concept is utilized to eliminate the effect of offset voltage. In the reset phase, when the RST signal is asserted high, the floating diffusion node FD is charged with the voltage VDD_RST. The switch AZ is closed, the signal A1 is applied to the capacitor Ca. The RST transistor and the auto-zeroing switch AZ are open. The charge voltage stored at the capacitor Ca is them measured. The value 1100 obtained during the reset conversion phase represents the effective value of noise and offset value of the source follower SF and the input stage offset voltage of the ADC. In the signal conversion phase, when the transistor TX is turned on (TX signal is asserted high), the pixel signal indicative of the photons received by the pixel is received. The capacitor Ca is now charged to the value of the pixel signal. The transistor TX is then turned off (TX signal is asserted low), the capacitor Ca. The pixel signal is them measured during the signal conversion phase, and the obtained value 1200 corresponds to the difference between the pixel signal and the offset voltage.

Figure 12:
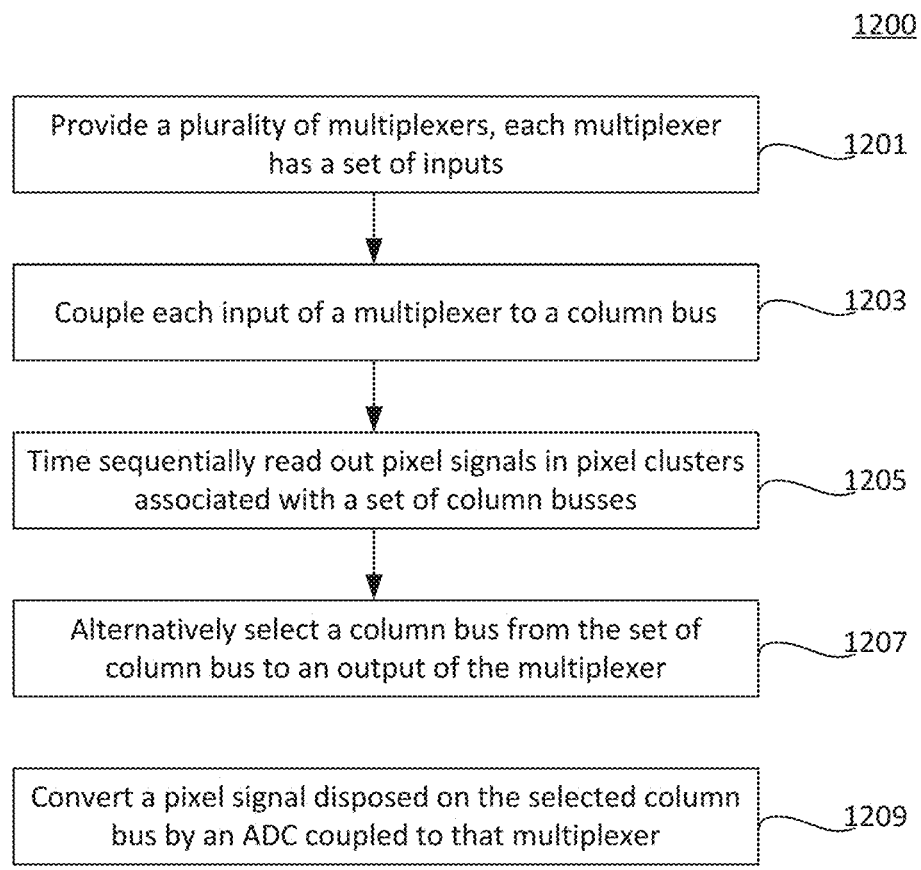
FIG. 12 is a simplified flowchart illustrating a method for reading out pixel signals from an image sensor according to an embodiment of the present disclosure.

FIG. 12 is a simplified flowchart illustrating a method 1200 for reading out pixel signals from an image sensor according to an embodiment of the present disclosure. The image sensor includes a pixel array having a plurality pixels arranged in a plurality of pixel clusters, which are coupled to a plurality of column busses, a plurality of voltage supplies coupled to the plurality of column busses, wherein adjacent column busses are supplied by different voltage supplies. The image sensor also includes a plurality of multiplexers having a set of inputs coupled to a set of column busses, a plurality of analog-to-digital converters (ADCs) coupled to the multiplexers, and a controller configured to selectively coupled a pixel signal of a column bus to an ADC through one of the multiplexers. Referring to FIG. 12, the method includes, at 1202, providing a plurality of multiplexers, each multiplexer has a set of inputs, as shown in FIGS. 4A, 4B, 5, and 6. Each multiplexer may include pass gates or transfer gates. At 1203, the method further includes connecting or coupling each input of the set of inputs of a multiplexer to a column bus of the column busses. At 1205, the method also includes time sequentially reading out pixel signals in pixel clusters associated with a set of column busses. Referring to FIG. 7, the pixel signals of the pixels P1, P2, P3, and P4 are time sequentially provided to column bus A and column bus B. At 1207, the multiplexer alternatively selects a column bus from the set of column busses to an output of the multiplexer by the controller, and the ADC converts a pixel signal disposed on the selected column at step 1209.

Although the inventive concepts of the present disclosure have been described with reference to exemplary embodiments, one skilled in the art will understand that various modifications and alterations may be made without departing from the scope if the present inventive concepts as defined by the following claims.

What is claimed is:

1. An image sensor comprising:
   a pixel array comprising a plurality of pixels arranged in a plurality of pixel clusters coupled to a plurality of column busses;
   a plurality of voltage supplies coupled to the plurality of pixel clusters, wherein pixel clusters in adjacent column busses are supplied with different voltage supplies;
   ping-pong readout circuitry comprising:
   multiplexing (MUX) circuitry coupled to the plurality of column busses; and
   a plurality of analog-to-digital converters (ADCs) coupled to the MUX circuitry; and
   a controller configured to selectively couple a pixel signal of a pixel cluster to a column bus to an ADC through the MUX circuitry for signal conversion,
   wherein each pixel cluster comprises a matrix of at least two columns of pixels and at least one row of pixels, each pixel of two adjacent pixel clusters being alternatively read out through two different column buses to an ADC by the MUX circuitry under control of the controller.

2. The image sensor of claim 1, wherein the MUX circuitry comprises a plurality of multiplexers, each multiplexer comprising M inputs coupled to M different column busses and an output coupled to one of the ADCs, M being a positive integer greater than unity.

3. The image sensor of claim 1, wherein each pixel cluster comprises a matrix of P pixel columns and Q pixel rows, and the MUX circuitry comprises a plurality of multiplexers each comprising P inputs and one output coupled to one of the ADCs, P and Q being positive integers greater than two.

4. The image sensor of claim 1, wherein the plurality of voltage supplies comprise two low-dropout voltage regulators (LDOs) having a same nominal voltage and electrically separated from each other.

5. The image sensor of claim 1, wherein each of the ADCs comprises a comparator and a counter.

6. The image sensor of claim 1, wherein each of the ADCs comprises a comparator, a counter, and an amplifier disposed between the MUX circuitry and the comparator.

7. The image sensor of claim 1, further comprising a data storage coupled to the plurality of ADCs and configured to store converted data of the pixels.

8. The image sensor of claim 1, wherein each of the pixel clusters is arranged as a 2 by 2 pixel matrix, and the MUX circuitry comprises a plurality of 2-to-1 analog multiplexers.

9. The image sensor of claim 1, wherein the pixel clusters are arranged in an array of R columns by S rows pixel matrix, and the MUX circuitry comprises a plurality of R-to-1 analog multiplexers, R and S being positive integers greater than two.

10. An image sensor comprising:
    a pixel array comprising a plurality of pixels arranged in a plurality of pixel clusters coupled to a plurality of column busses;
    a plurality of voltage supplies coupled to the plurality of pixel clusters, the voltage supplies having a same nominal voltage and physically separated from each other, wherein pixel clusters in adjacent column busses are supplied with different voltage supplies; and
    a plurality of analog-to-digital converters (ADCs) coupled to the plurality of column busses, wherein each ADC comprises an input stage comprising a first operational amplifier and a second operational amplifier connected in parallel, the first and second operational amplifiers each having a variable bias current and configured to receive a pixel signal of a pixel cluster coupled to a column bus.

11. The image sensor of claim 10, wherein each of the first operational amplifier and the second operational amplifier comprises:
    a first input coupled to a pixel of a pixel cluster through a column bus;
    a second input coupled to a reference voltage;

a first capacitor coupled between the first input and ground; and a switch disposed between the first input and a multiplexer (MUX).

12. The image sensor of claim 11, further comprising:

a second capacitor disposed between a column bus and the first capacitor and configured to charge the first capacitor with a signal voltage.

13. The image sensor of claim 12, wherein the signal voltage is a reset voltage when an ADC is in a reset conversion phase, and the signal voltage is a pixel signal voltage when the ADC is in a signal conversion phase.

14. The image sensor of claim 10, wherein the variable bias current of the first operational amplifier is greater than the variable bias current of the second operational amplifier small when the ADC performs a conversion of pixel signal passing through the first operational amplifier, and vice versa.

15. The image sensor of claim 10, wherein the input stage further comprises:

a multiplexer (MUX) having two MUX inputs configured to receive two pixel signals from two adjacent column busses.

16. A method for reading out pixel signals from an image sensor comprising a pixel array having a plurality pixels arranged in a plurality of pixel clusters coupled to a plurality of column busses, a plurality of voltage supplies coupled to the plurality of column busses, wherein adjacent column busses are supplied by different voltage supplies, a plurality of multiplexers having a set of inputs coupled to a set of column busses, a plurality of analog-to-digital converters (ADCs) coupled to the multiplexers, and a controller configured to selectively coupled a pixel signal of a column bus to an ADC through one of the multiplexers, the method comprising:

coupling each input of the set of inputs of a multiplexer to a column bus of the column busses;

time sequentially reading out pixel signals in pixel clusters associated with a set of column busses, wherein each pixel cluster comprises a matrix of at least two columns of pixels and at least one row of pixels;

alternatively selecting a column bus from the set of column busses to an output of the multiplexer by the controller;

converting a pixel signal disposed on the selected column by an ADC coupled to the multiplexer, such that each pixel of two adjacent pixel clusters is alternatively read out through two different column buses to an ADC by the multiplexers under control of the controller.

17. The method of claim 16, wherein the set of inputs of a multiplexer comprise N inputs, the set of column busses comprise N column busses, N being a positive integer equal to or greater than two.

18. The method of claim 16, wherein the plurality of voltage supplies comprise two low-dropout voltage regulators having a same nominal voltage and physically separated from each other.

19. The method of claim 16, wherein each of the ADCs comprises a comparator and a counter.

* * * * *